United States Patent
Troxtell, Jr.

(10) Patent No.: US 6,823,652 B2
(45) Date of Patent: Nov. 30, 2004

(54) HIGH DENSITY TAPE CARRIER SYSTEM AND METHOD OF OPERATION

(75) Inventor: Clessie A. Troxtell, Jr., Howe, TX (US)

(73) Assignee: Texas Instruments Incorporated, Dallas, TX (US)

( * ) Notice: Subject to any disclaimer, the term of this patent is extended or adjusted under 35 U.S.C. 154(b) by 154 days.

(21) Appl. No.: 10/212,403

(22) Filed: Aug. 5, 2002

(65) Prior Publication Data

US 2002/0195372 A1 Dec. 26, 2002

Related U.S. Application Data

(62) Division of application No. 09/703,985, filed on Oct. 30, 2000, now Pat. No. 6,467,627.
(60) Provisional application No. 60/162,324, filed on Oct. 28, 1999.

(51) Int. Cl.[7] .................................................. B65B 11/52

(52) U.S. Cl. ........................... 53/427; 53/471; 53/329.3

(58) Field of Search .......................... 53/427, 453, 467, 53/478, 471, 329.3; 206/390, 701, 713, 714, 716, 722, 725

(56) References Cited

U.S. PATENT DOCUMENTS

| | | | |
|---|---|---|---|
| 4,654,693 A | | 3/1987 | Funakoshi et al. |
| 5,076,427 A | | 12/1991 | Thomson et al. |
| 5,361,901 A | | 11/1994 | Schenz et al. |
| 5,390,472 A | | 2/1995 | Weiler et al. |
| 5,499,717 A | | 3/1996 | Hayashi |
| 5,648,136 A | | 7/1997 | Bird |
| 5,729,963 A | * | 3/1998 | Bird .............................. 53/471 |
| 6,076,681 A | | 6/2000 | Chenoweth |
| 6,149,010 A | | 11/2000 | Tanaka et al. |

* cited by examiner

Primary Examiner—Rinaldi I. Rada
Assistant Examiner—John Paradiso
(74) Attorney, Agent, or Firm—Wade James Brady, III; Frederick J. Telecky, Jr.

(57) ABSTRACT

A flexible carrier tape system, suitable for housing components and for winding on a reel in high density, is disclosed, comprising an elongated base strip having a plurality of longitudinally spaced cavities with side walls having a step-like groove near the surface around the cavity, comprising further an elongated cover strip having a width matching the width of the cavity including the widths of the grooves, the cover strip sealed onto the base strip so that the cover strip rests on the step-like grooves. In one embodiment, the sealed cover strip forms a substantially uniform plane with the upper surface of the base strip. The thickness consumed by each tape winding becomes a minimum so that a high density of components can be stored and transported.

12 Claims, 2 Drawing Sheets

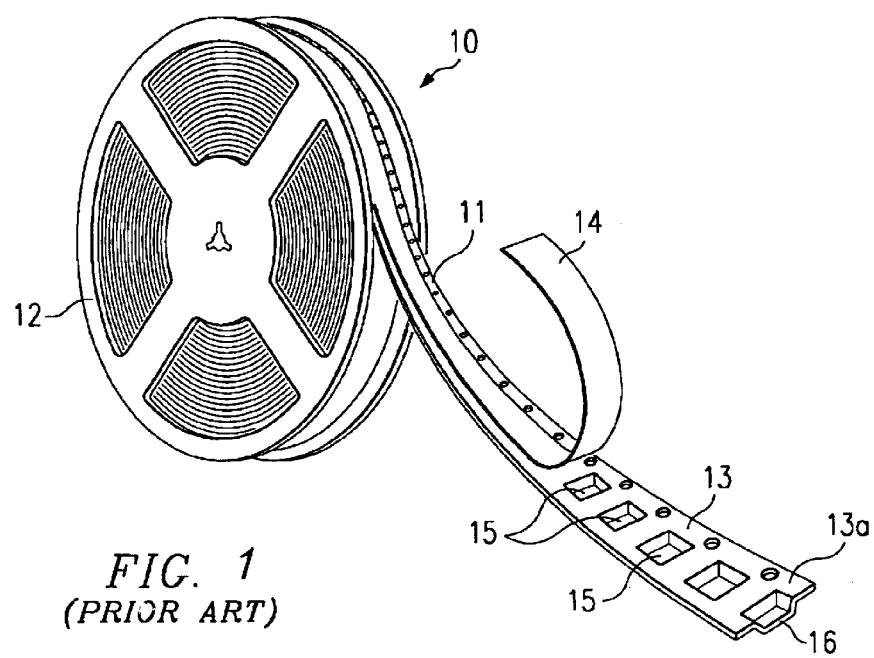
FIG. 1
(PRIOR ART)
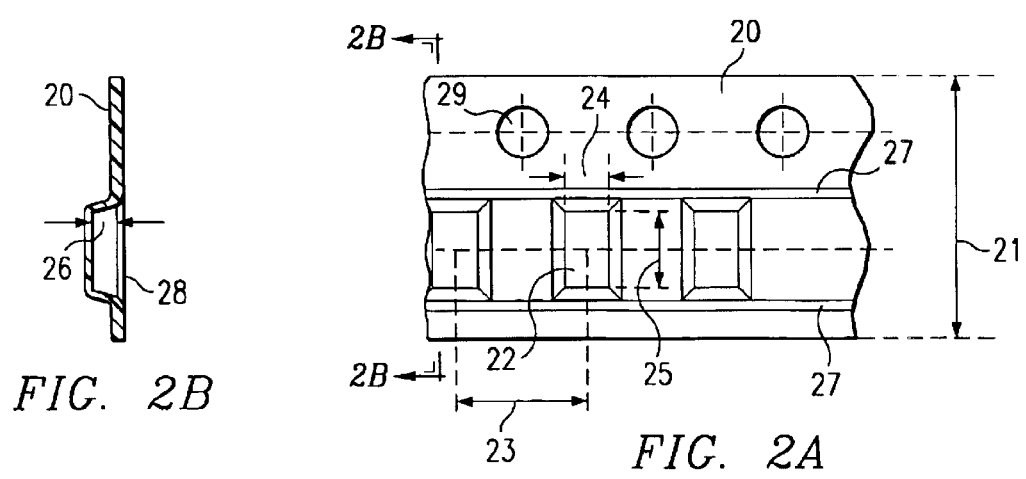
FIG. 2B
FIG. 2A

HIGH DENSITY TAPE CARRIER SYSTEM AND METHOD OF OPERATION

This is a divisional application of Ser. No. 09/703,985 filed Oct. 30, 2000, now U.S. Pat. No. 6,467,627, claims priority from provisional application Ser. No. 60/162,324 filed Oct. 28, 1999.

BACKGROUND OF THE INVENTION

The present invention is related in general to the field of semiconductor devices and processes and more specifically to the design and operation of tape carriers for high density storage and transport of semiconductor devices.

DESCRIPTION OF THE RELATED ART

Many semiconductor devices are packed by the manufacturer, and then transported to the customer, in carrier tapes wound onto a reel. Cavities are embossed into the tape to form pockets designed according to industry standards; in each pocket is commonly accommodated one semiconductor device of given size and configuration.

When the carrier tape is covered by a cover tape, industry standards such as EIA 481-1, 481-2, and 481-3 regulate the design of the tape pockets. A number of patents have tried to address the problems of placing an electronic component into the cavities securely and prevent any unforeseen movement of the component which could damage its sensitive parts. Other patents discussed options of covering the cavities for protection and transportation.

In U.S. Pat. No. 5,648,136, issued on Jul. 15, 1997 (Bird, "Component Carrier Tape"), the design of a flexible carrier tape for storage and delivery of components, and the advancement mechanism of the tape system are described. Aligned pockets in the tape have an adhesive thermoplastic elastomer on the bottom wall in order to retain the components in the pockets. It is difficult for the proposed system to meet the stringent storage and delivery reliability requirements of advanced semiconductor devices, and to allow easy component removal by the customer for rapid component assembly.

These difficulties are not resolved in the follow-up proposals in U.S. Pat. Nos. 5,729,963, issued on Mar. 24, 1998 (Bird, "Component Carrier Tape"), and 5,846,621, issued on Dec. 8, 1998 (Nagamatsu, "Component Carrier Tape Having Static Dissipative Properties"). In the latter patent, a layer of static dissipative acrylic polymer is added to the strip portion of the carrier system. The cover is releasably, adhesively bonded to the strip portion, covering a plurality of pockets. The acrylic polymer is also used to reduce the temperature at which the cover is bonded to the strip portion.

The problem of sealing the cover tape to the component carrier tape is addressed by radically opposite approaches in the following two patents: U.S. Pat. No. 5,234,104, issued on Aug. 10, 1993 (Schulte et al., "Carrier Tape System"), describes a cover strip having a top surface and opposed side walls extending downwardly from the top surface. The opposed sidewalls are spaced apart from each other a distance substantially equal to the width of the base strip. The cover strip further includes retaining means formed integrally therewith for mechanically engaging and holding down thin component parts seated in cavities formed in the base strip. The retaining means is comprised of a pair of spaced apart rail members which are formed coextensive with the cover strip extending longitudinally to the sidewalls and projecting downwardly and outwardly from the top surface thereof. The rail members are flared outwardly at a slight angle toward the respective opposed sidewalls. The proposed solution is expensive, impractical to assemble by the manufacturer and impractical to unload by the customer.

U.S. Pat. No. 5,931,337, issued on Aug. 3, 1999 (Ando et al., "Semiconductor Accommodating Devices and Method for Inserting and Taking Out Semiconductor Devices"), describes an embossed tape, wound on a reel, without using the customary top cover tape. The embossed tape has a bottom wall for placing a semiconductor device thereon, two sidewalls upwardly extending from both side edges of the bottom wall, and top walls having an opening. The sidewalls are formed such that the semiconductor device inserted through the opening is held by the sidewalls with the semiconductor device placed on the bottom wall. The arrangement is inflexible for geometrical changes of the device outlines, and the reliability of transportation is questionable.

An urgent need has therefore arisen for a coherent, low-cost method of fabricating a carrier tape, wound onto a reel in high density, with a cover tape reliably sealed to the carrier tape. The method should be flexible enough to be applied for different semiconductor product families, should allow high density packing and tape winding, and should achieve improvements toward the goal reliably inserting and extracting small outline and low profile packages. Preferably, these innovations should be accomplished using the installed equipment base so that no investment in new manufacturing machines is needed.

SUMMARY OF THE INVENTION

According to the present invention, a flexible carrier tape system, suitable for housing components and for winding on a reel in high density, is disclosed, comprising an elongated base strip having a plurality of longitudinally spaced cavities with side walls having a step-like groove near the surface around the cavity, comprising further an elongated cover strip having a width matching the width of the cavity including the widths of the grooves, the cover strip sealed onto the base strip so that the cover strip rests on the step-like grooves.

In one embodiment, the sealed cover strip forms a substantially uniform plane with the upper surface of the base strip. The thickness consumed by each tape winding becomes a minimum.

In another embodiment, the cover strip rests in the step-like grooves and also on the top surface of the housed components. Any movement of the components is impeded.

In yet another embodiment, the cover strip bulges around the top surface of the housed components, pressuring them onto the bottom wall of the cavities. Any movement of the components is prevented.

The present invention is related to any products of type and size, which can be stored and delivered in cavities in plastic tapes. A prominent group of these products include electronic components and semiconductor devices. Among the semiconductor devices, components can be found in many integrated circuit families such as standard linear and logic products, processors, digital and analog devices, high frequency and high power devices, and both large and small area chip categories. The invention is equally useful to semiconductor manufacturers and device users, which may be found in cellular communications pagers, hard disk drives, laptop computers and medical instrumentation.

By way of example and using the familiar acronyms for identifying semiconductor devices, the invention applies predominantly to devices from the product families of TSOP, SOIC, SSOP, TSSOP, TVSOP, BGA, rectangular as well as square QFP, TQFP, LQFP, and CSP (chip-scale and chip-size packages); it further applies to SOT23, TO-220, and TO-89 packages, and many more.

It is an aspect of the present invention to provide a technology for maximizing the amount of tape windings fitting on a reel, and thus the amount of product, housed in plastic cavities in the tape, stored and delivered per reel. The aspect is achieved by designing step-like grooves around the storage cavities in the base strip so that the cover strip can rest in these grooves and form a substantially uniform plane with the upper surface of the base strip.

Another aspect of the invention is to provide a method of preventing movement of the stored components without using adhesives. This aspect is achieved by applying the cover strip under slight pressure to the housed component.

Another aspect of the invention is to increase product quality to the customer by eliminating damage due to handling, a common problem in storing and delivering components.

Another aspect of the invention is to introduce packing concepts for a wide variety of components which are flexible so that they can be applied to many product families, especially of electronic and semiconductor types, and are general so that they can be applied to several future generations of products.

Another aspect of the invention is to provide a low-cost, high-speed process for fabrication with minimum movement of parts and product in the assembly equipment, and reach these goals without equipment changes and using the installed fabrication equipment base.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

FIG. 1 is a schematic and simplified perspective view of a reel winding a flexible carrier tape including a base strip having cavities and a cover strip.

FIG. 2A is a schematic top view of the embossed base strip of FIG. 1.

FIG. 2B is a cross sectional view of a cavity in the base strip for housing components.

DETAILED DESCRIPTION OF THE PREFERRED EMBODIMENTS

Figure 3:
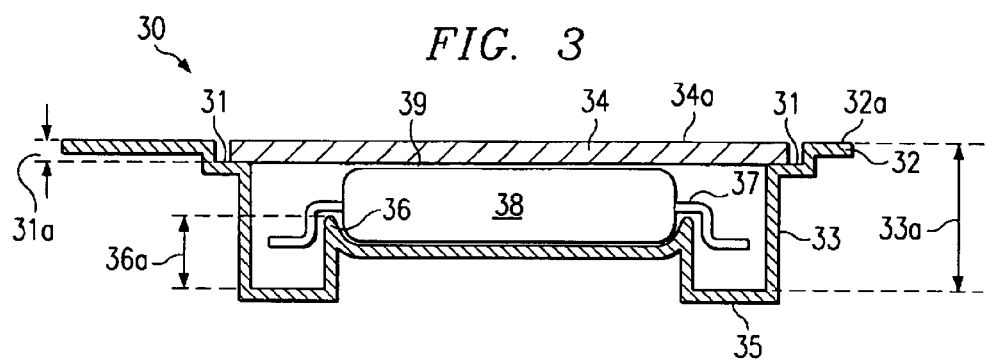
FIG. 3 is a schematic and simplified cross section of a cavity in the base strip of the carrier tape according to the first embodiment of the invention.

FIG. 1 depicts a tape and reel configuration, generally designated 10, as commonly used in many industries for storage and transport of products from the manufacturer to the customer. The prominent example for this invention is the semiconductor industry. The tape and reel configuration is designed for feeding electronic components such as semiconductor devices to automatic placement machines in the customer house for board assemblies. Commonly, surface mount technology is employed; consequently, the tape is designed to be suitable for surface mount semiconductor packages.

A flexible carrier tape 11 is wound on a reel 12, preferably in high density. For most applications, the carrier tape 11 comprises an elongated base strip 13 and elongated cover strip 14. The cover strip is sealed to the base strip along the edges. In base strip 13, a plurality of cavities 15 is embossed, preferably equally spaced in longitudinal direction. Base strip 13 has an upper surface 13a; the cavities 15 extend downward from this upper surface 13a to a predetermined depth suitable for housing components such as semiconductor devices. The fact of the embossed cavities is indicated in FIG. 1 by the curved bending of tape wall 16.

The tape material suitable for the base strips of this invention is typically polystyrene or polystyrene laminate, preferably in a thickness range from about 0.2 to 0.4 mm (unformed film), dependent largely on the size and weight of the component to be carried by the tape. The cover strip may be the same material yet thinner, or another material selected such that the strip sealing temperature remains preferably in the range 150 to 200° C. These materials are commercially available from suppliers worldwide. In the USA, examples are the companies Advantek, ITW, Expotech and Martinez; in Japan, Dainippon and Shin Etsu; in Korea, SVM and Allkey; in Malaysia, C-Pak and ITW; in Singapore, Dou Yee and Sumicarrier; in the Philippines, ITW.

After the composite tape 11 is loaded with the components and sealed, it is wound onto reel 12. The reel is placed into a corrugated shipping box for transport and delivery.

The base strip 13 of carrier tape 11 is illustrated in more detail by example of FIGS. 2A and 2B, with examples for design, dimensions, and component types tabulated in Table 1 of the Appendix. FIG. 2A shows in top view base strip 20 having width 21 (called "W" in Table 1 of the Appendix). Embossed in base strip 20 is a plurality of cavities 22. They are preferably uniformly spaced by pitch 23 (called "P" in Table 1) in longitudinal direction. Each cavity is characterized by length 24 (called "X" in Table 1) and width 25 (called "Y" in Table 1). For square shaped cavities, length 24 and width 25 have the same dimensions; for round cavities, a diameter is substituted for length and width. Holes 29 are needed to index the carrier tape in the pick-and-place machines in the end-user's assembly line.

Figure 4:
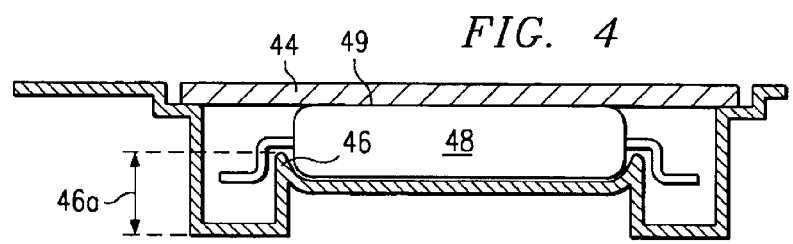
FIG. 4 is a schematic and simplified cross section of a cavity in the base strip of the carrier tape according to the second embodiment of the invention.
Figure 5:
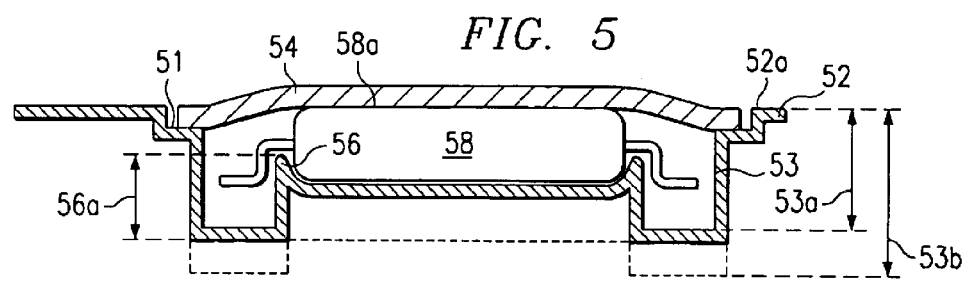
FIG. 5 is a schematic and simplified cross section of a cavity in the base strip of the carrier tape according to the third embodiment of the invention.

FIG. 2B is created by cross sectioning one of the cavities in FIG. 2A along line "2B—2B". The figure illustrates the depth 26 (called "D" in Table 1) of the cavity. The cavity is shown in FIG. 2B in schematic manner, having a flat bottom wall and sidewalls substantially with only small inclination. As FIGS. 3 to 5 show in more detail, however, the bottom wall has preferably a plurality of ridges for engaging the stored components.

Pivotally important for the present invention are the grooves 27 of FIG. 2A. They have a step-like configuration, as shown in more detail in FIGS. 3 to 5, and serve to support the cover strip (designated 28 in FIG. 2B) for easy sealing. The grooves extend continuously from one cavity to the next along the whole length of the carrier tape.

As the schematic cross section of a carrier tape cavity in FIG. 3 indicates, the step-like grooves 31 are near the surface 32a of the base strip 32 forming the cavity. The grooves surround, at least partially, the cavity and are located where the cavity side walls 33 meet with surface 32a. In FIG. 3, the cavity is generally designated 30; it represents the first embodiment of the present invention. The purpose of the grooves is to offer a secure location for resting the cover tape 34. This means that the depth 31a of the grooves has to be sufficient for the thickness of cover tape 34 (typically between 0.02 and 0.08 mm). The cover tape can then be placed so that its surface 34a forms a substantially uniform plane with the upper surface 32a of the base strip.

FIG. 3 further illustrates that the bottom wall 35 of the cavity has a plurality of ridges 36 disposed in the bottom portion of the cavity. They serve to engage peripheral portions 37 of the components 38, stored in the cavity, at predetermined lateral positions within the cavity. FIG. 3 shows that a small distance 39 remains as a gap between the surface of the stored component 38 and the cover strip 34. The total depth 33a of the cavity is predetermined to house component 38 in the cavity which rests on the ridges 36. Numerical examples of depth 33a are compiled as parameter "D" in Table 1 of the Appendix. For the distance 36a, which takes account of the height of the ridges 36, numerical examples are compiled as parameter "E" in Table 1.

Since cover strip 34 forms a substantially uniform plane with surface 32a; depth 33a defines the radial distance consumed by each tape winding on the reel of FIG. 1. This solution permits the maximum number of tape windings per reel diameter and thus provides a high density tape carrier system.

The second preferred embodiment of the present invention is depicted in the schematic cross section of FIG. 4. In contrast to FIG. 3, the height 46a of the ridges 46, supporting component 48, is elevated so that there is no gap 49 left between the surface of the stored component 48 and the cover strip 44. Consequently, the top surface of component 48 is contacting cover strip 44, mechanically engaging component 48 in order to impede any movement of the component. The component is thus confined into its position in the cavity.

The third preferred embodiment of the present invention is depicted in the schematic cross section of FIG. 5. In contrast to the embodiments illustrated in FIGS. 3 and 4, the depth 53a of the sidewalls 53 is reduced (the depth 53b denotes the dimension of the sidewalls in FIGS. 3 and 4). For constant height 56a of the bottom ridges 56 of the cavity, this reduction of side wall depth causes the upper surface 58a of the stored component 58 to protrude over the upper surface 52a of the base strip 52. Consequently, the cover strip 54 has to be applied under slight mechanical pressure against component 58 so that it can rest in the step-like grooves 51. After sealing of the cover strip 54 to the carrier base strip 52, the mechanical pressure is released. By spring-like action from the ridges 56, the component 58 rebounds against cover strip 54 and pushes it slightly upward. As a consequence, cover strip 54 slightly bulges around the top surface 58a of component 58. The component is thus confined into its position in the cavity and any unwanted movement of the component is prevented.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip in the electronic components may comprise silicon, silicon germanium, gallium arsenide, or any other semiconductor material used in manufacturing. As another example, the ridges supporting the electronic component in the tape cavities may have a number of different shapes, including one or more holes in the plastic material. As another example, the components stored and transported in the cavities may be different objects from cavity to cavity, or may originate from a variety of production realms. It is therefore intended that the appended claims encompass any such modifications or embodiments.

TABLE 1

| Component Family | # P/N | Reel diameter [mm] | X [mm] | Y [mm] | D [mm] | E [mm] | P [mm] | W [mm] |
|---|---|---|---|---|---|---|---|---|
| SOIC | 8 | 330 | 6.4 | 5.2 | 2.1 | N/A | 8 | 12 |
|  | 14 | 330 | 6.5 | 9 | 2.1 | N/A | 8 | 16 |
|  | 16 | 330 | 6.5 | 10.3 | 2.1 | N/A | 8 | 16 |
|  | 16 | 330 | 11.1 | 10.85 | 2.65 | 2.35 | 12 | 16 |
|  | 20 | 330 | 11.1 | 13.35 | 2.7 | 2.35 | 12 | 24 |
|  | 24 | 330 | 11.1 | 15.9 | 2.7 | 2.35 | 12 | 24 |
|  | 28 | 330 | 11.35 | 18.67 | 3.1 | 2.44 | 16 | 32 |
| TSSOP | 8 | 330 | 7 | 3.6 | 1.6 | 1.2 | 8 | 12 |
|  | 14 | 330 | 7 | 5.6 | 1.6 | 1.2 | 8 | 12 |
|  | 16 | 330 | 7 | 5.6 | 1.6 | 1.2 | 8 | 12 |
|  | 20 | 330 | 6.95 | 7.1 | 1.6 | 1.2 | 8 | 16 |
|  | 24 | 330 | 6.95 | 8.3 | 1.6 | 1.2 | 8 | 16 |
|  | 48 | 330 | 8.6 | 15.8 | 1.8 | 1.3 | 12 | 24 |
|  | 56 | 330 | 8.6 | 15.8 | 1.8 | 1.3 | 12 | 24 |
|  | 64 | 330 | 8.4 | 17.3 | 1.7 | 1.2 | 12 | 24 |
| SOP | 8 | 330 | 8.2 | 6.6 | 2.5 | 2.1 | 12 | 16 |
|  | 14 | 330 | 8.2 | 10.5 | 2.5 | 2.1 | 12 | 16 |
|  | 16 | 330 | 8.2 | 10.5 | 2.5 | 2.1 | 12 | 16 |
|  | 20 | 330 | 8.2 | 13 | 2.5 | 2.1 | 12 | 24 |
|  | 24 | 330 | 8.2 | ?? | 2.5 | 2.1 | 12 | 24 |
| SSOP | 14 | 330 | 8.2 | 6.6 | 2.5 | 2.1 | 12 | 16 |
|  | 16 | 330 | 8.2 | 6.6 | 2.5 | 2.1 | 12 | 16 |
|  | 20 | 330 | 8.2 | 7.5 | 2.5 | 2.1 | 12 | 16 |
|  | 24 | 330 | 8.2 | 8.8 | 2.5 | 2.1 | 12 | 16 |
|  | 28 | 330 | 8.2 | 10.5 | 2.5 | 2.1 | 12 | 16 |
|  | 30 | 330 | 8.2 | 10.5 | 2.5 | 2.1 | 12 | 16 |
|  | 38 | 330 | 8.2 | 13 | 2.5 | 2.1 | 12 | 24 |

TABLE 1-continued

| Component Family | # P/N | Reel diameter [mm] | X [mm] | Y [mm] | D [mm] | E [mm] | P [mm] | W [mm] |
|---|---|---|---|---|---|---|---|---|
| | 28 | 330 | 11.35 | 9.78 | 3.1 | 2.44 | 12 | 24 |
| | 48 | 330 | 11.35 | 16.2 | 3.1 | 2.44 | 16 | 32 |
| | 56 | 330 | 11.35 | 18.67 | 3.1 | 2.44 | 16 | 32 |
| | 16 | 330 | 6.4 | 5.2 | 2.1 | N/A | 8 | 16 |
| | 20 | 330 | 6.5 | 10.3 | 2.1 | N/A | 8 | 16 |
| | 24 | 330 | 6.5 | 10.3 | 2.1 | N/A | 8 | 16 |
| TVSOP | 14 | 330 | 6.8 | 4 | 1.6 | 1.2 | 8 | 12 |
| | 16 | 330 | 6.8 | 4 | 1.6 | 1.2 | 8 | 12 |
| | 20 | 330 | 7 | 5.6 | 1.6 | 1.2 | 8 | 12 |
| | 24 | 330 | 7 | 5.6 | 1.6 | 1.2 | 8 | 12 |
| | 48 | 330 | 6.8 | 10.1 | 1.6 | 1.2 | 12 | 24 |
| | 56 | 330 | 6.8 | 11.7 | 1.6 | 1.2 | 12 | 24 |
| | 80 | 330 | 8.4 | 17.3 | 1.7 | 1.2 | 12 | 24 |
| TQFP | 64 | 330 | 12.5 | 12.5 | 1.9 | 1.6 | 16 | 24 |
| Powerflax | 2 | 330 | 6.5 | 10 | 2.45 | 2.2 | 8 | 16 |
| | 3 | 330 | 9.8 | 11 | 2.45 | 2.2 | 12 | 24 |
| | 5 | 330 | 9.8 | 11 | 2.45 | 2.2 | 12 | 24 |
| PLCC | 20 | 330 | 10.3 | 10.3 | 4.9 | 3.8 | 12 | 16 |
| | 28 | 330 | 13 | 13 | 4.9 | 3.7 | 16 | 24 |
| | 44 | 330 | 18 | 18 | 5.7 | 4.1 | 24 | 32 |
| MicroStarBGA | 96 | 330 | 5.7 | 13.7 | 2 | 1.2 | 8 | 24 |
| | 114 | 330 | 5.7 | 16.2 | 2 | 1.2 | 8 | 24 |
| SOT | 3 | 330 | 4.85 | 4.52 | 2.3 | 1.85 | 8 | 12 |
| | 5 | 178 | 2.24 | 2.34 | 1.22 | n/a | 4 | 8 |
| | 5 | 178 | 3.15 | 3.2 | 1.4 | n/a | 4 | 8 |
| TO-92 paper tape | 3 | 360 | | n/a | n/a | n/a | 13 | 18 |

I claim:

1. A method for storing and transporting electronic components, comprising the steps of:

providing a carrier tape comprising:
an elongated base strip having an upper surface and a plurality of longitudinally spaced cavities extending downwardly from said upper surface for housing electronic components therein, said upper surface also including parallel grooves extending continuously from one cavity to the next along the length of the carrier tape;
each of said cavities having sidewalls and a bottom wall, said bottom wall having a plurality of ridges disposed therein for engaging peripheral portions of said electronic components disposed within said cavities, for confining said components at fixed lateral positions within said cavities;

placing an electronic component in each said cavity;

covering said components in said cavities with an elongated planar cover strip having a width matching the width of said cavities including the widths of said grooves;

seating said cover strip onto said base strip so that said cover strip rests in said grooves and forms a substantially uniform plane with said upper surface.

2. The method of claim 1, wherein said step of providing a carrier tape comprising an elongated base strip having cavities comprises providing a tape wherein said cavities have form selected from a group consisting of cuboid, cubic, cylindrical and semispherical shapes.

3. The method of claim 1, wherein said steps of providing a carrier tape comprises providing a tape made of a material selected from a group consisting of polystyrene and polystyrene laminate.

4. The method of claim 1, wherein said step of placing an electronic component comprises placing a semiconductor device.

5. A method for storing and transporting electronic components comprising the steps of:

providing a carrier tape comprising:
an elongated base strip having an upper surface and a plurality of longitudinally spaced cavities extending downwardly to a depth from said upper surface approximately equal to the thickness of components to be housed therein;
each of said cavities having sidewalls and a bottom wall, said bottom wall having a plurality of ridges disposed therein for engaging peripheral portions of said components disposed within said cavities, for confining said components at fixed lateral positions within said cavities and substantially preventing lateral movement of said components within said cavities;
said upper surface also including parallel grooves extending continuously from one cavity to the next along the length of the carrier tape;

placing an electronic component in each said cavity;

providing and covering said components in said cavities with an elongated planar cover strip having a width matching the width of said cavities including the widths of said grooves;

sealing said cover strip onto said base strip so that said cover strip rests in said grooves, forms a substantially uniform plane with said upper surface, and contacts the top surface of said components.

6. The method of claim 5, wherein said step of providing a carrier tape comprising an elongated base strip having cavities comprises providing a tape wherein said cavities have form selected from a group consisting of cuboid, cubic, cylindrical and semispherical shapes.

7. The method of claim 5, wherein said steps of providing a carrier tape comprises providing a tape made of a material selected from a group consisting of polystyrene and polystyrene laminate.

8. The method of claim 5, wherein said step of placing an electronic component comprises placing a semiconductor device.

9. A method for storing and transporting electronic components, comprising the steps of:

providing a carrier tape comprising:

an elongated base strip having an upper surface and a plurality of longitudinally spaced cavities extending downwardly to a depth from said upper surface slightly less than the thickness of components to be housed therein;

each of said cavities having sidewalls and a bottom wall, said bottom wall having a plurality of ridges disposed therein for engaging peripheral portions of said components disposed within said cavities, for confining said components at fixed lateral positions within said cavities;

said upper surface also including parallel grooves extending continuously from one cavity to the next along the length of the carrier tape;

placing an electronic component in each said cavity;

covering said components in said cavities with an elongated planar cover strip having a width matching the width of said cavities including the widths of said grooves; and sealing said cover strip onto said base strip so that said cover strip rests in said grooves around said cavities, bulges around the top surface of said components, and pressures said components onto said bottom ridges.

10. The method of claim 9, wherein said step of providing a carrier tape comprising an elongated base strip having cavities comprises providing a tape wherein said cavities have form selected from a group consisting of cuboid, cubic, cylindrical and semispherical shapes.

11. The method of claim 9, wherein said steps of providing a carrier tape comprises providing a tape made of a material selected from a group consisting of polystyrene and polystyrene laminate.

12. The method of claim 9, wherein said step of placing an electronic component comprises placing a semiconductor device.

* * * * *